United States Patent
Hendriks et al.

(10) Patent No.: US 6,740,602 B1
(45) Date of Patent: May 25, 2004

(54) METHOD OF FORMING LOW-DIELECTRIC CONSTANT FILM ON SEMICONDUCTOR SUBSTRATE BY PLASMA REACTION USING HIGH-RF POWER

(75) Inventors: Menso Hendriks, Soest (NL); Naoto Tsuji, Tama (JP); Satoshi Takahashi, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 10/391,030

(22) Filed: Mar. 17, 2003

(51) Int. Cl.[7] ............................ H01L 21/31; H01L 23/58
(52) U.S. Cl. ..................... 438/780; 438/680; 257/642
(58) Field of Search ........................... 438/623, 743, 438/758, 763, 770, 773, 780, 789, 792

(56) References Cited

U.S. PATENT DOCUMENTS 5,989,998 A * 11/1999 Sugahara et al. .......... 438/623
6,051,321 A * 4/2000 Lee et al. .................. 428/447
6,054,379 A    4/2000 Yau et al.
6,514,880 B2 * 2/2003 Matsuki et al. ............ 438/780

* cited by examiner

*Primary Examiner*—Caridad Everhart
*Assistant Examiner*—Calvin Lee
(74) *Attorney, Agent, or Firm*—Knobbe Martens Olson & Bear LLP

(57) ABSTRACT

A method for forming a film having a low dielectric constant and high mechanical hardness on a semiconductor substrate by plasma reaction includes the steps of: (i) introducing a silicon-containing hydrocarbon gas as a source gas into a reaction space for plasma CVD processing wherein a semiconductor substrate is placed; and (ii) applying radio-frequency (RF) power of 1,000 W or higher to the reaction space while maintaining a pressure of the reaction space at 100 Pa or higher to activate plasma polymerization reaction in the reaction space, thereby forming a thin film on the semiconductor substrate.

31 Claims, 3 Drawing Sheets

METHOD OF FORMING LOW-DIELECTRIC CONSTANT FILM ON SEMICONDUCTOR SUBSTRATE BY PLASMA REACTION USING HIGH-RF POWER

BACKGROUND OF THE INVENTION

1. Field of the Invention

This invention relates generally to a semiconductor technique and more particularly to a film with a low dielectric constant (referred to as "low-k") formed on a semiconductor substrate by using a plasma CVD (chemical vapor deposition) apparatus.

2. Description of the Related Art

Because of the recent rise in requirements for the large-scale integration of semiconductor devices, a multi-layered wiring technique attracts a great deal of attention. In these multi-layered structures, however, capacitance among individual wires hinders high speed operations. In order to reduce the capacitance it is necessary to reduce dielectric constant of the dielectric film. Thus, various materials having a relatively low dielectric constant have been developed for insulation films. Further, a hard mask such as SiN is used in formation of semiconductor structure, but such a film has a dielectric constant of around 8. It is also preferable for hard masks to have a low dielectric constant.

A reduction of dielectric constant can be achieved by methods disclosed in U.S. Pat. Nos. 6,352,945, 6,383,955, 6,410,463, and 6,432,846, all of which are incorporated herein by reference in their entirety. In these methods, siloxan polymers are formed from organo-silicon reactant materials in a plasma CVD apparatus wherein the residence time of a reaction gas flowing through a reaction chamber is lengthened. Although the films composed of siloxan polymers deposited by the methods show low dielectric constants and reasonable mechanical properties as compared with films composed of conventional silicon oxide films, hardness of the films is not targeted in the above U.S. patents.

SUMMARY OF THE INVENTION

One aspect of this invention involves a method for forming a film having a low dielectric constant and high mechanical hardness on a semiconductor substrate by plasma reaction. In an embodiment, a method comprises the steps of: (i) introducing a silicon-containing hydrocarbon gas as a source gas into a reaction space for plasma CVD processing wherein a semiconductor substrate is placed, said silicon-containing hydrocarbon being capable of self-polymerization or polymerization with cross-linkers to form siloxan polymers by plasma reaction; and (ii) applying radio-frequency (RF) power of 1,000 W or higher (e.g., 1,000–20,000 W, preferably 2,000–15,000 W, and in an embodiment, 3,000–10,000 W) to the reaction space while maintaining a pressure of the reaction space at 100 Pa or higher to activate plasma polymerization reaction in the reaction space, thereby forming a thin film on the semiconductor substrate. According to the embodiment, a film having a low dielectric constant of 2.5–3.2, preferably 2.8–3.1, can have as high hardness as 1.0–5.0 GPa, preferably 1.5–3.5 GPa.

In another embodiment, a method further comprises introducing an inert gas such as Ar, Ne, and He into the reaction space to maintain the pressure during the plasma polymerization reaction. The flow of inert gas may be 5–200% of the source gas, preferably 10–120% (including 20%, 40%, 60%, 80%, 100%, and a range including any two of the foregoing).

In an embodiment, the: pressure may be 300–1,000 Pa (including 400 Pa, 500 Pa, 600 Pa, 700 Pa, 800 Pa, and a range including any two of the foregoing). For plasma polymerization, relatively high pressure is preferable. Further, RF power may be 1,000–20,000 W (including 1,500 W, 2,000 W, 2,500 W, 3,000 W, 3,500 W, 4,000 W, 5,000 W, 6,000 W, 7,000 W, 8,000 W, 9,000 W, 10,000 W, 12,000 W, and 15,000 W, and a range including any two of the foregoing). The above may apply to a substrate having a diameter of 300 mm, although any suitable size substrate can be treated. High RF power can be expressed by power density (W/cm$^2$). In the present invention, the RF power density may be in the range of 1.4 to 28 W/cm$^2$, preferably, 2.8 to 21 W/cm$^2$, and in an embodiment, 4.2 to 14 W/cm$^2$). The density can be calculated by dividing the total intensity (W) by the area of a substrate (cm$^2$). For example, if a substrate having a diameter of 300 mm is used, the area is approximately 707 cm$^2$, and 2,000 W is 2.8 W/cm$^2$.

Further, the RF power can be applied by overlaying high-frequency power and low-frequency power. Overlaying two frequencies is effective in promoting plasma polymerization. A high frequency may be 2 MHz or higher (including 5 MHz, 10 MHz, 15 MHz, 20 MHz, 25 MHz, and 30 MHz, e.g., 13.4_MHz or 27.12 MHz) and a low frequency may be lower than 2 MHz (including 1 MHz, 500 kHz, and 200 kHz, e.g., 400 kHz or 430kHz). The low frequency power may be 0% to 10% of the high frequency power (including 1%, 2%, 3%, 4%, 5%, 6%, 7%, 8%, 9%, and a range of any two of the foregoing).

In an embodiment, no oxidizing gas may be added to the source gas for plasma polymerization reaction. When using a silicon-containing hydrocarbon having oxygen atoms in an amount effective to form a siloxan polymer structure, no oxidizing gas need to be added. The films deposited are not silicon oxide films. When adding an oxidizing gas, its flow may be less than 50% of the source gas, preferably 10%–30%.

In another example, a cross-linker agent such as alkanol and unsaturated hydrocarbon may be added as an additive gas, depending on the type of source gas (i.e., whether radical groups are not sufficient in the source gas compound itself). The flow of such cross-linkers, if any, may be 30%–200%, preferably 50%–150%.

As described above, in the present invention, a method comprises the steps of: (i) introducing a silicon-containing hydrocarbon gas as a source gas into a reaction space for plasma CVD processing; and (ii) applying radio-frequency (RF) power of 1,800 W or higher (preferably 2,000 W or higher) to the reaction space while maintaining a pressure of the reaction space at 100 Pa or higher (preferably 400 Pa or higher) to activate plasma polymerization reaction in the reaction space. In connection to high RF power application, U.S. Pat. No. 6,051,321 to Lee discloses the deposition of low-k films by plasma assisted CVD or transport polymerization techniques. In Lee, power levels in a range of 100 W to 4,000 W are used only when operating at very low pressures ranging from 0.01 mTorr to 10 mTorr (i.e., 0.0013 to 1.3 Pa) (column 19). These conditions relate to the technique of high density plasma CVD. Lee teaches that when the power is high, the pressure must be very low. In the present invention, the pressure is higher than Lee's by the factor of 10$^3$–10$^5$. In the present invention, by applying high RF power at relatively high pressures, the hardness of a film can increase without significantly increasing the dielectric constant of the film composed of a siloxan polymer formed from silicon-containing hydrocarbon compounds.

The present invention can be adapted to any suitable film formation methods using various source gases, which include, but are not limited to, the methods disclosed in U.S. patent application No. 10/288,641 filed Nov. 5, 2002, U.S. patent application No. 09/827,616 filed Apr. 6, 2001, U.S. Pat. No. 6,352,945, U.S. Pat. No. 6,383,955, U.S. Pat. No. 6,410,463, and U.S. Pat. No. 6,432,846, all of which are incorporated herein by reference in their; entirety. The films deposited can be used as an insulation film, etch stop film, hard mask, cap film, etc.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
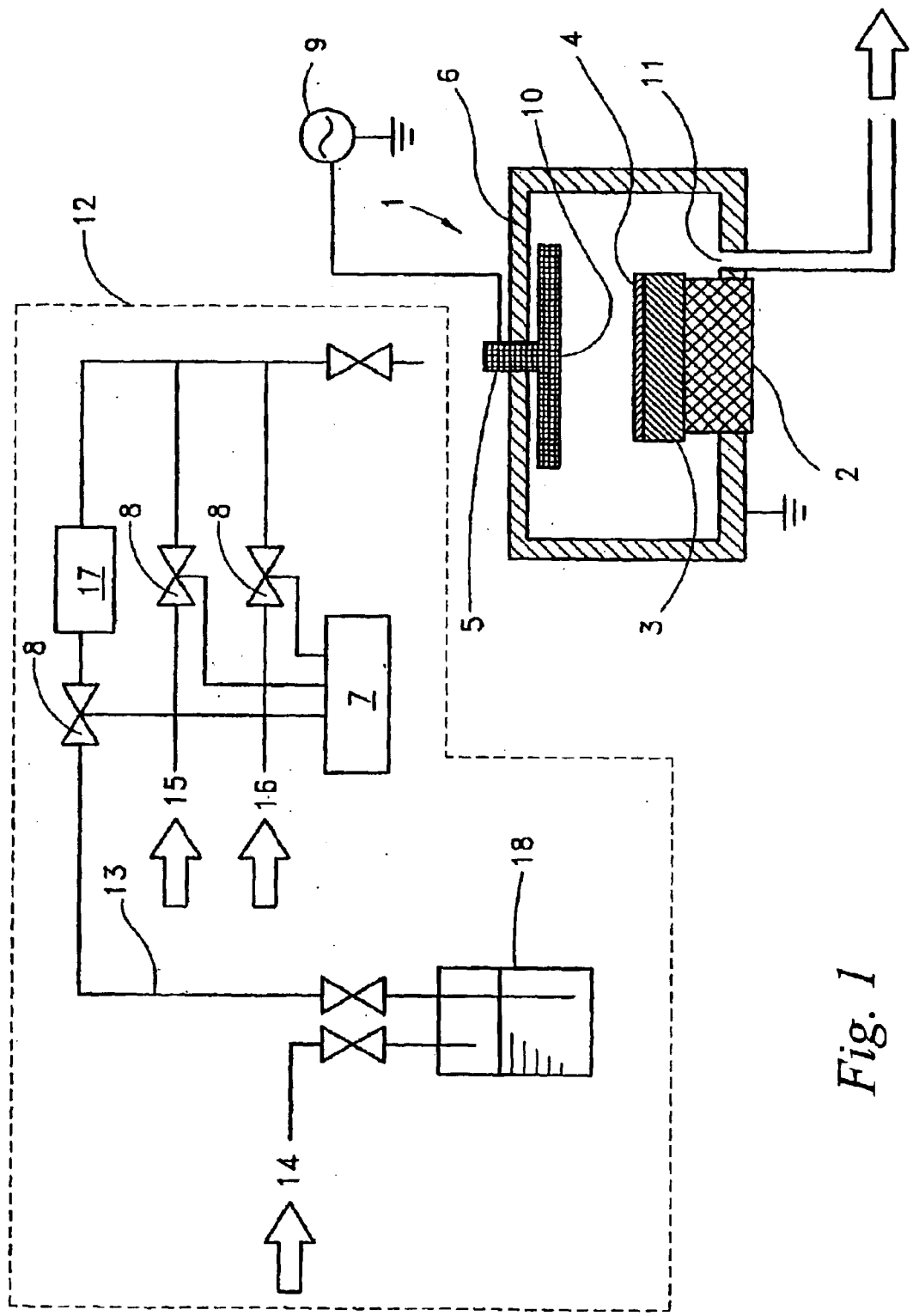
FIG. 1 is a schematic diagram illustrating a plasma CVD apparatus used for forming an insulation film of this invention.

As described above, according to the present invention, in an embodiment, the applied plasma power is increased to a value in excess of 2,000 Watts for a 300 mm wafer, and preferably the applied plasma power is increased to a value around 3,000 Watts or higher. In another embodiment, the applied plasma power is increased to a value in excess of 2,000 Watts for a 300 mm wafer while maintaining a residence time of the reaction gas in a plasma CVD apparatus in excess of 100 msec. The reaction gas is a mixture of a source gas, an inert gas, and any other additive gases such as an oxidizing gas or a cross-linking gas.

In the present invention, any suitable conditions can be employed as long as plasma polymerization reaction is initiated. In an embodiment, the residence time, Rt, of a reaction gas in the reaction space may be controlled at 100 msec≦Rt to promote formation of polymer structures.

$$Rt[s] = 9.42 \times 10^7 (Pr \cdot Ts/Ps \cdot Tr) r_w^2 d/F$$

wherein Pr: reaction space pressure (Pa); Ps: standard atmospheric pressure (Pa); Tr: average temperature of the reaction gas (K); Ts: standard temperature (K); $r_w$: radius of the silicon substrate (m); d: space between the silicon substrate and the upper electrode (m); F: total flow volume of the reaction gas (sccm).

When using a remote plasma chamber to excite an inert gas and/or a source gas, the interior of the remote plasma chamber and the conduits connecting the remote plasma chamber and the reaction chamber need to be taken into consideration when determining the flow of the gas: A preferred range of Rt is 100 msec≦Rt, more preferably at least 165 msec, including 200 msec≦Rt≦5 sec.

For example, based on the equation, Rt can be determined as follows:

DM-DMOS (dimethyl dimethoxysilane): 240 sccm

He: 100 sccm $O_2$:0 sccm

RF power supply: 3000W (by overlaying 13.4 MHz power and 430 kHz power)

Pr (reaction chamber pressure): 532 Pa

Tr (average temperature of the reaction gas): 673 K $r_w$ (radius of the silicon substrate): 0.1 m d (space between the silicon substrate and the upper electrode): 0.024 m F (total flow volume of the reaction gas): 340 sccm Ps (standard atmospheric pressure): $1.01 \times 10^5$ Pa Ts (standard temperature): 273 K Rt (residence time; $Rt[s] = 9.42 \times 10^7 (Pr \cdot Ts/Ps \cdot Tr) r_w^2 d/F$): 160 ms In a preferred embodiment, a silicon-containing hydrocarbon compound expressed by the general formula $Si_\alpha O_\beta C_x H_y$ ($\alpha$, $\beta$, x, and y are integers) is vaporized and then introduced into a reaction space of a plasma CVD apparatus. The reaction space may be the interior of a reaction chamber where a substrate is placed.

Compounds which can be used as a source gas include a compound having at least one Si-O bond, two or less $O-C_n H_{2n+1}$ bonds and at least two hydrocarbon radicals con (Si). A preferable silicon-containing hydrocarbon compound has formula:

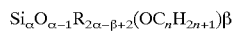

$$Si_\alpha O_{\alpha-1} R_{2\alpha-\beta+2}(OC_n H_{2n+1})_\beta$$

wherein $\alpha$ is an integer of 1–3, $\beta$ is 0, 1, or 2, n is an integer of 1–3, and R is $C_{1-6}$ hydrocarbon attached to Si.

Further, in the present invention, the silicon-containing hydrocarbon compound can be any suitable compounds having structures accomplishing polymerization or oligomerization of a basal structures of the compounds under prolonged residence time conditions. The basal structure includes, but is not limited to, (i) a cyclosiloxan compound which may preferably have the formula $Si_n O_n R_{2n-m}$ wherein n is an integer of 3–6, m represents the number of a unsaturated bond between Si and C and is an integer of 1–6 (m≦n), and R is $C_{1-6}$ saturated or unsaturated hydrocarbon attached to Si, and (ii) a linear siloxan compound which may preferably have the formula $Si_\alpha O_{\alpha-1} R_{2\alpha-\beta+2}$ wherein $\alpha$ is an integer of 1–3, $\beta$ is 0, 1, or 2 ($\beta \leq \alpha$), n is an integer of 1–3, and R is $C_{1-6}$ hydrocarbon attached to Si.

Reactive groups which form oligomers using the basal structures include, but are not limited to, alkoxy group such as —O—$CH_3$, unsaturated hydrocarbon such as —CH=$CH_3$, group such as —$NH_2$, acid radical such as carboxylic radical —COOH and acetoxyl group —OOC$CH_3$, and alcohol including $C_{1-6}$ alkanol such as 1,2-propanediol. The reactive group (s) and the basal structure can be included in a single compound or different compounds. That is, as long as the reactive group(s) and the basal structure exist and forms oligomers, compounds can be used singly or in any combination.

In another embodiment, the aforesaid basal structure and the reactive group(s) are included in a single compound. For example, in the general formula $(Si_nO_nR_{2n-m}) X_m$, wherein X is $—O—C_pH_{2p+1}$ wherein p is an integer of 1–4 (preferably 1 or 2) such as $—O—CH_3$, or $—C_2H_{2(z-w)+2}$ wherein z is an integer of 1–(preferably 1 or 2), and w represents the number of unsaturated carbon bonds and is an integer of 1–3 (preferably 1) such as $—CH=CH_3$. These compounds include 1,3,5-trimethyl-1,3,5-trimethoxycyclotrisiloxane and 1,3,5-trimethyl-1 ,3,5-trivinyilycyclotrisiloxane.

In still another embodiment of the present invention, the silicon-containing hydrocarbon compound may have, as the basal structure, a linear siloxan compound which may preferably have the formula $(Si_\alpha O_{\alpha-1}R_{2\alpha\beta+2})X_\beta$ or a cyclosiloxan compound which may preferably have the formula $(Si_nO_nR_{2n-m})X_m$, wherein X is a reactive group including, but not limited to, an amino group such as $—NH_2$, and an acid radical such as carboxylic radical—COOH and acetoxyl group $—OOCCH_3$. These compounds includes $H_2N—Si(CH_3)_2—NH_2$ and $CH_3COO—Si(CH_3)_2—OOCCH_3$. In the above, if the amino group-containing compound and the acid radical-containing compound are mixed, polymerization can be enhanced by acid-alkali reaction.

In the above, the reactive groups are attached to the basal structure in a single compound, but the reactive groups and the basal structure can be different compounds wherein a reactive group gas is separately added to a basal structure compound to cause oligomization by acid-alkali reaction. For example, the reactive group gas can be any suitable gas including N such as dimethylamine $((CH_3)_2NH)$, N,N—dimethylhydaazine $((CH_3)_2NNH_2)$, ethylazide $(C_2H_5N_3)$, methylamine $(CH_3NH_2)$, and methylhydrazine $(CH_3NHNH_2)$.

Additionally, all of the aforesaid compounds and the reactive groups can be used singly or in a combination of at least two of any compounds and/or at least two of any reactive groups.

The film of this invention has a relatively high stability because its fundamental structure has the Si-O bond having high bonding energy therebetween. Also, its relative dielectric constant is low because it has a micropore porous structure. Further, the fundamental structure $(—SiO—)_n$ has, on both sides, dangling bonds ending with a hydrocarbon radical possessing hydrophobicity, and this property renders the humidity-resistance. Furthermore, the bond of a hydrocarbon radical and silicon is generally stable.

Further aspects, features and advantages of this invention will become apparent from the detailed description of the preferred examples which follows.

FIG. 1 diagrammatically shows a plasma CVD apparatus usable in this invention. This apparatus comprises a reaction gas-supplying device 12 and a plasma CVD device 1. The reaction gas-supplying device 12 comprises plural lines 13, control valves 8 disposed in the lines 13, and gas inlet ports 14, 15 and 16. A flow controller 7 is connected to the individual control valves 8 for controlling a flow of a source gas of a predetermined volume. A container accommodating liquid reacting material 18 is connected to a vaporizer 17 that directly vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming an insulation film on a semiconductor substrate by using the plasma CVD apparatus of this invention comprises a step of directly vaporizing silicon-containing hydrocarbon compounds expressed by the general formula $Si_\alpha O_\beta C_x H_y$ ($\alpha$, $\beta$, x, and y are integers) and then introducing it to the reaction chamber 6 of the plasma CVD device 1, a step of introducing an additive gas, whose flow is substantially reduced, into the reaction chamber 6 and also a step of forming an insulation film on a semiconductor substrate by plasma polymerization reaction wherein mixed gases, made from the silicon-containing hydrocarbon compound as a source gas and the additive gas, are used as a reaction gas. It is a remarkable feature that the reduction of the additive gas flow also renders a substantial reduction of the total flow of the reaction gas. This feature will be described in more detail later.

The additive gases used in this embodiment, more specifically, are argon gas and helium gas. Argon is principally used for stabilizing plasma, while helium is used for improving uniformity of the plasma and also uniformity of thickness of the insulation film.

In the method described above, the first step of direct vaporization is a method wherein a liquid material, the flow of which is controlled, is instantaneously vaporized at a vaporizer that is preheated. This direct vaporization method requires no carrier gas such as argon to obtain a designated amount of the source gas. This differs greatly with the bubbling method. Accordingly, a large amount of argon gas or helium gas is no longer necessary and this reduces the total gas flow of the reaction gas and then lengthens the time in which the source gas stays in the plasma. As a result, sufficient polymerizing reactions occur in the vapor so that a linear polymer can be formed and a film having a micropore porous structure can be obtained.

In FIG. 1 inert gas supplied through the gas inlet port 14 pushes out the liquid reacting material 18, which is the silicon-containing hydrocarbon compound, to the control valve 8 through the line 13. The control valve 8 controls the flow of the liquid reacting material 18 with the flow controller 7 so that it does not exceed a predetermined volume. The reduced silicon-containing hydrocarbon compound 18 goes to the vaporizer 17 to be vaporized by the direct vaporization method described above. Argon and helium are supplied through the inlet ports 15 and 16, respectively, and the valve 8 controls the flow volume of these gases. The mixture of the source gas and the additive gases, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF voltages, which are preferably 27.12

MHz and 400 kHz, and the space serves as a plasma field. The susceptor 3 continuously heats the semiconductor substrate 4 with the heater 2 and maintains the substrate 4 at a predetermined temperature that is desirably 350–450° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas can lengthen its residence time.

Extremely reducing the total volume of the reaction gas is effected by reducing the flow volume of the additive gas. As a result, the residence time of the reaction gas can be lengthened so that a linear polymer is deposited sufficiently and subsequently an insulation film having a micropore porous structure can be formed.

In order to adjust the reaction in the vapor phase, it is effective to add a small amount of an inert gas, an oxidizing agent, or a reducing agent to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the source gas in the vapor phase can be controlled. Molecules of the reaction gas undergo polymerization in the vapor phase, thereby forming oligomers. The oligomers are expected to have a O:Si ratio of 1:1. However, when the oligomers form a film on the substrate, the oligomers undergo further polymerization, resulting in a higher oxygen ratio. The ratio varies depending on the relative dielectric constant or other characteristics of a film formed on the substrate. To supply oxygen for polymerization, an oxidizing gas may be added. The flow of oxidizing gas such as O2, NO2, and CO2, may be less than 50% of the source gas, preferably 10%–30%.

EXAMPLE

Experiments were conducted as described below. In the experiments, DM-DMOS (dimethyl dimethoxysilane) was used as a source gas, and an conventional plasma CVD device (Eagle™, ASM Japan K. K.) was used as an experimental device. The conditions for forming the film are shown in Tables 1-1, 2-1, and 3-1. The results are shown in Tables 1-2, 2-2, and 3-3. In the tables, "DM" is DM-DMOS, "P" is pressure, "HF" is high frequency (27.12 MHz), "LF" is low frequency (400 kHz), "Gap" is a distance between the substrate and the upper electrode (the showerhead), "Sus" is a temperature of the susceptor, "wall" is a temperature of inner walls of the reactor, "SHD" is a temperature of the showerhead, "EM" is elasticity modulus, and "k value" is an dielectric constant.

In Experiment 1, as shown in Table 1-1, substrates having a diameter of 200 mm were used, and no additive gas was used. In Experiment 2, as shown in Table 2-1, substrates having a diameter of 300 mm were used, and as an additive gas, 1,2-propanediol was added at 200 sccm. In Experiment 3, as shown in Table 3-1, substrates having a diameter of 300 mm was used, and as an additive gas, oxygen was added at 100 sccm.

TABLE 1-1

φ200 mm tool; Additive: none

| No. | Gas flow (sccm) DM | He | P (Pa) | RF power (W) HF | LF | Gap (mm) | Temperature (C.) Sus | wall | SHD |
|---|---|---|---|---|---|---|---|---|---|
| 1-1 | 140 | 30 | 660 | 1700 | — | 24 | 430 | 120 | 170 |
| 1-2 | | | | 2000 | — | | | | |
| 1-3 | 140 | 30 | 560 | 1700 | — | 24 | 430 | 120 | 170 |
| 1-4 | | | | 2000 | — | | | | |
| 1-5 | 140 | 30 | 610 | 1700 | — | 24 | 430 | 120 | 170 |
| 1-6 | | | | 2000 | — | | | | |

TABLE 1-2

| No. | Mechanical property (Gpa) Hardness | EM | k value |
|---|---|---|---|
| 1-1 | 1.86 ± 0.04 | 9.68 ± 0.13 | 2.81 |
| 1-2 | 1.44 ± 0.03 | 7.62 ± 0.10 | 2.84 |
| 1-3 | 1.33 ± 0.03 | 7.09 ± 0.12 | 2.92 |
| 1-4 | 2.03 ± 0.04 | 10.39 ± 0.23 | 2.89 |
| 1-5 | 1.42 ± 0.06 | 7.05 ± 0.25 | 2.84 |
| 1-6 | 1.70 ± 0.03 | 8.93 ± 0.06 | 2.87 |

TABLE 2-1

φ300 mm tool; Additive: 1,2-propanediol 200 sccm

| No. | Gas flow (sccm) DM | He | P (Pa) | RF power (W) HF | LF | Gap (mm) | Temperature (C.) Sus | wall | SHD |
|---|---|---|---|---|---|---|---|---|---|
| 2-1 | 148 | 158 | 700 | 3510 | 60 | 26 | 430 | 140 | 160 |
| 2-2 | | | | 2340 | | | | | |
| 2-3 | | | | 1230 | | | | | |
| 2-4 | 148 | 158 | 600 | 1230 | 60 | 28 | 430 | 140 | 160 |
| 2-5 | | | | 2340 | | | | | |
| 2-6 | | | | 2630 | | | | | |
| 2-7 | | | | 3510 | | | | | |

TABLE 2-2

| No. | Mechanical property (Gpa) Hardness | EM | k value |
|---|---|---|---|
| 2-1 | 2.72 ± 0.05 | 15.21 ± 0.13 | 2.96 |
| 2-2 | 2.10 ± 0.04 | 11.38 ± 0.09 | 2.85 |
| 2-3 | 0.67 ± 0.05 | 4.36 ± 0.11 | 2.81 |
| 2-4 | 0.86 ± 0.04 | 5.89 ± 0.14 | 2.84 |
| 2-5 | 2.46 ± 0.04 | 13.24 ± 0.08 | 2.88 |
| 2-6 | 2.63 ± 0.04 | 14.51 ± 0.18 | 2.89 |
| 2-7 | 3.15 ± 0.05 | 17.99 ± 0.13 | 3.01 |

TABLE 3-1

φ300 mm tool; Additive: $O_2$ 100 sccm

| No. | Gas flow (sccm) DM | He | P (Pa) | RF power (W) HF | LF | Gap (mm) | Temperature (C.) Sus | wall | SHD |
|---|---|---|---|---|---|---|---|---|---|
| 3-1 | 270 | 160 | 500 | 2000 | 120 | 24 | 430 | 140 | 170 |
| 3-2 | | | | 3000 | | | | | |
| 3-3 | 270 | 160 | 633 | 2000 | 120 | 24 | 430 | 140 | 170 |

TABLE 3-1-continued

φ300 mm tool; Additive: O₂ 100 sccm

| No. | Gas flow (sccm) DM | He | P (Pa) | RF power (W) HF | LF | Gap (mm) | Temperature (C.) Sus | wall | SHD |
|---|---|---|---|---|---|---|---|---|---|
| 3-4 | | | | 3000 | | | | | |
| 3-5 | 330 | 160 | 500 | 2000 | 120 | 24 | 430 | 140 | 170 |
| 3-6 | | | | 3000 | | | | | |
| 3-7 | 330 | 160 | 633 | 2000 | 120 | 24 | 430 | 140 | 170 |
| 3-8 | | | | 3000 | | | | | |

TABLE 3-2

| | Mechanical property (Gpa) | |
|---|---|---|
| No. | Hardness | EM |
| 3-1 | 2.32 | 11.86 |
| 3-2 | 2.83 | 14.79 |
| 3-3 | 1.77 | 8.56 |
| 3-4 | 2.23 | 11.44 |
| 3-5 | 2.05 | 10.32 |
| 3-6 | 2.39 | 11.70 |
| 3-7 | 1.71 | 8.63 |
| 3-8 | 1.89 | 9.47 |

Figure 2:
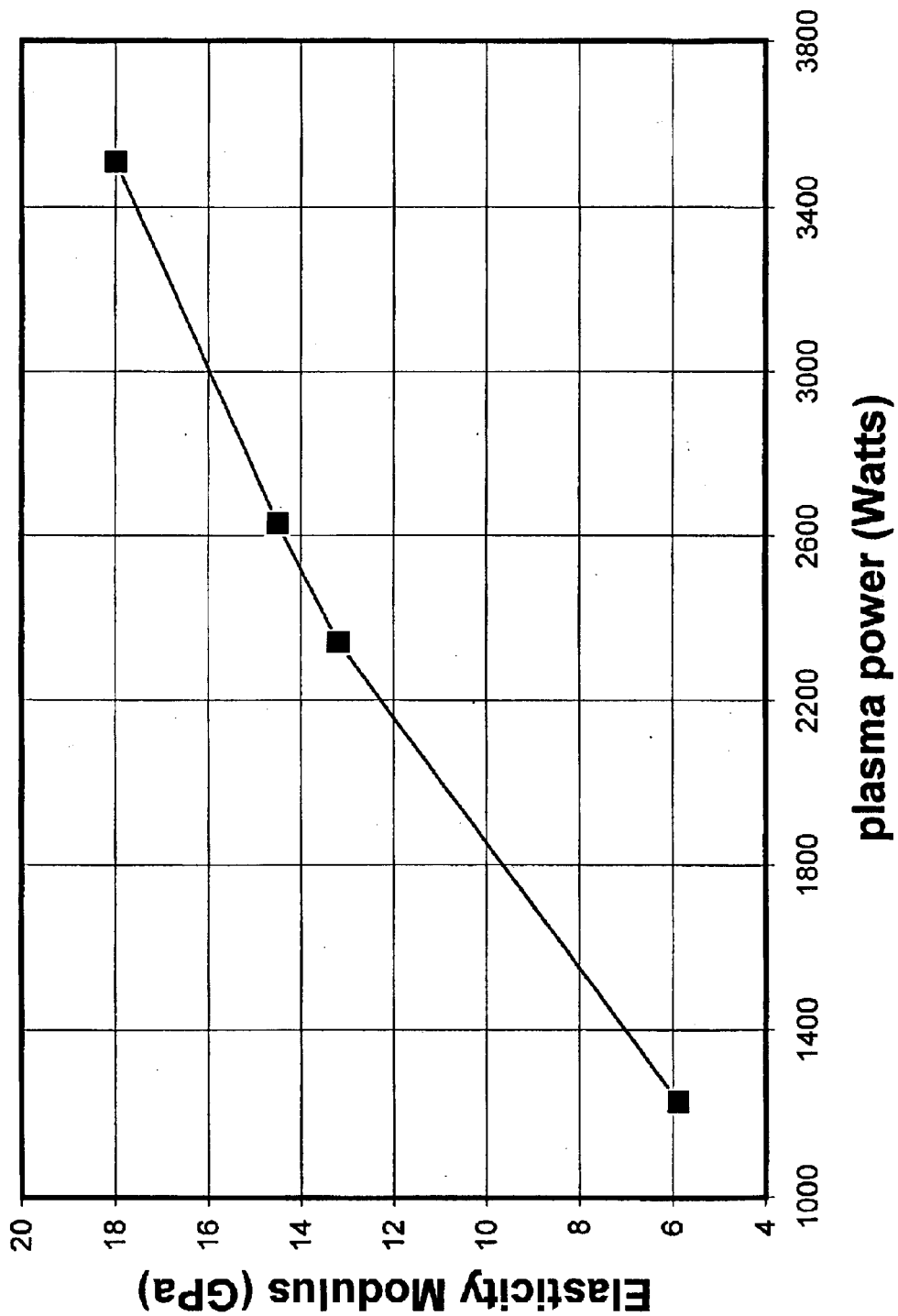
FIG. 2 is a graph showing the relation between applied plasma power and the Elasticity Modulus of a deposited film.
Figure 3:
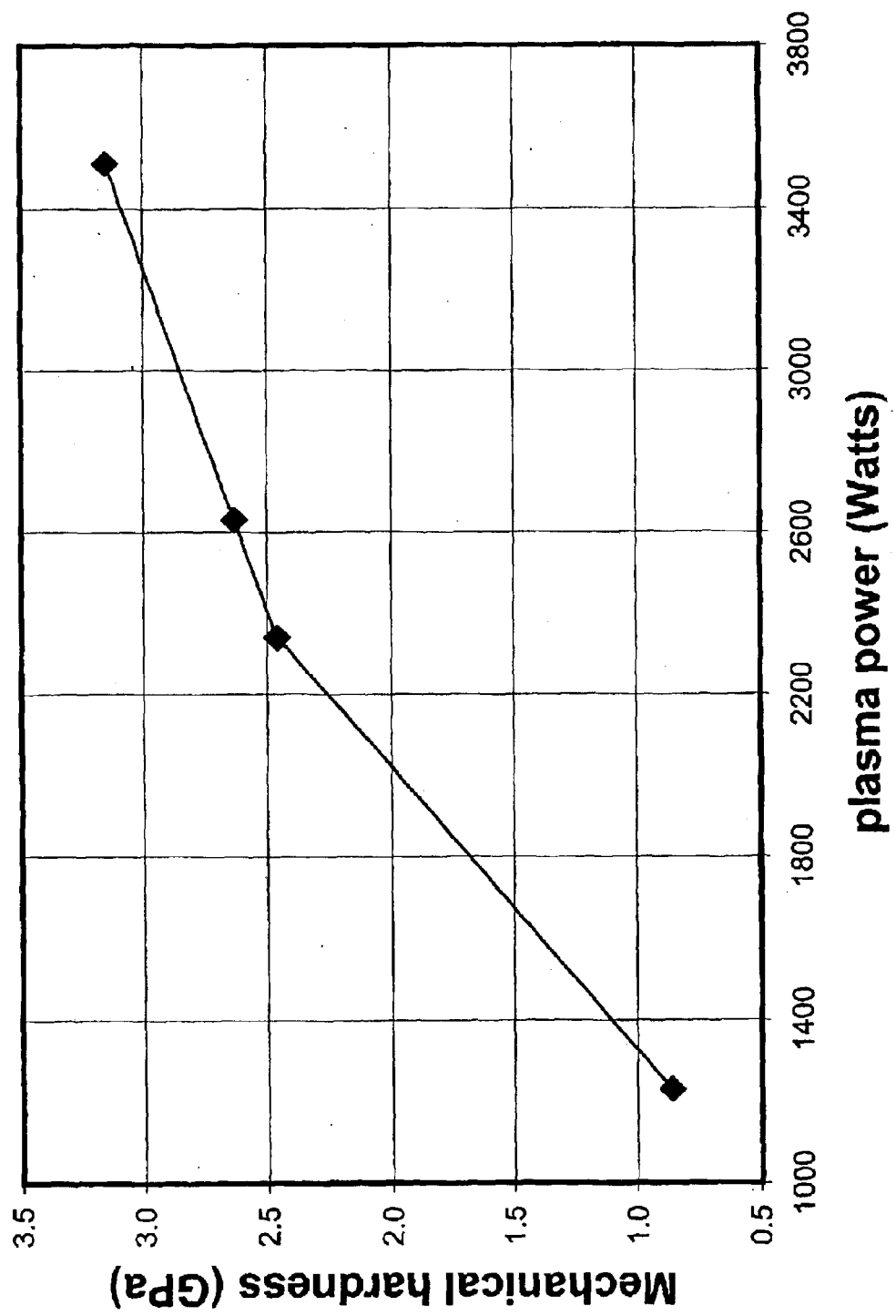
FIG. 3 is a graph showing the relation between applied plasma power and the Mechanical Hardness of a deposited film.

As shown in the tables, when the RF power is high (over 1,500 W, further over 2,000 W) under a relatively high pressure, the hardness and the elasticity modulus of the resultant films become significantly high without significant increases of the dielectric constant. Further, when a cross-linker gas or an oxidizing gas (especially a cross-linker gas) is added, the mechanical strength further increases. Also, FIGS. 2 and 3 show the results of Experiments 2.4, 2.5, 2.6 and 2.7.

Although this invention has been described in terms of certain examples, other examples apparent to those of ordinary skill in the art are within the scope of this invention. Accordingly, the scope of the invention is intended to be defined only by the claims that follow. The present invention includes various embodiments and are not limited to the above examples. The present invention is particularly applicable to, but not limited to, the following embodiments and any combination of these embodiments:

1) A method is for forming a film on a semiconductor substrate by plasma reaction and comprises the steps of: (i) vaporizing a silicon-containing hydrocarbon compound to provide a source gas; (ii) introducing the source gas into a reaction space for plasma CVD processing wherein a semiconductor substrate is placed; (iii) optionally introducing an additive gas selected from the group consisting of an inert gas and an oxidizing gas, said oxidizing gas being used in an amount less than the source gas, said source gas and said additive gas constituting a reaction gas; and (iv) forming an insulation film on the semiconductor substrate by activating plasma polymerization reaction in the reaction space, wherein the plasma polymerization reaction is activated while controlling the flow of the reaction gas to lengthen a residence time, Rt, of the reaction gas in the reaction space, wherein 100 msec≦Rt, $$Rt[s]=9.42\times10^7 \ (Pr \cdot Ts/Ps \cdot Tr)r_w^2 d/F$$

wherein Pr: reaction space pressure (Pa); Ps: standard atmospheric pressure (Pa); Tr: average temperature of the reaction gas (K); Ts: standard temperature (K); $r_w$: radius of the silicon substrate (m); d: space between the silicon substrate and the upper electrode (m); F: total flow volume of the reaction gas (sccm).

In the above, the reaction space should not be limited to a physically defined single section, but should include any suitable space for plasma reaction. That is, as one of ordinary skill in the art readily understands, the space is a functionally defined reaction space. The space may be comprised of a physically defined single section such as the interior of a reactor, or physically defined multiple sections communicated with each other for plasma reaction, such as the interior of a remote plasma chamber and the interior of a reactor. Further, the space includes the interior of piping connecting multiple sections through which a reaction gas passes. The interior of the reactor includes only the space used for plasma reaction. Thus, if only a part of the reactor interior is used for plasma reaction where the reactor is composed of multiple sections, only the part used for plasma reaction constitutes a reaction space. Further, the plasma reaction includes a preliminary reaction for plasma polymerization. For example, upstream of a reactor, heating a reaction gas (e.g., 150° C. to 500° C., preferably 200° C. to 300° C., in a pre-heater chamber), exciting a reaction gas (e.g., in a remote plasma chamber), or mixing an excited additive gas and a source gas (e.g., in a pre-heater chamber) is included in a preliminary reaction.

2) In the method according to Item 1, the source gas and the additive gas are separately introduced into the reaction space. The additive gas and the source gas can be mixed upstream of a reactor and introduced into the reactor. However, they can be introduced separately, depending on the configuration of a reactor. As long as the gases are not in a reactive state, regardless of whether the additive gas and the source gas are mixed or separated, the space where the gases are present does not constitute a reaction space. At a point where additive gas and the source gas are in contact in a reactive state, the reaction space begins. The reactive state includes states where the reaction gas is heated or excited, or the excited additive gas and the source gas are mixed, for example.

3) In the method according to Item 1 or 2, the plasma polymerization reaction comprises exciting the reaction gas and depositing the film on the substrate. As described above, the plasma polymerization reaction includes a preliminary reaction such as excitation of the reaction gas.

4) In the method according to any one of Items 1–3, the reaction space comprises a space for exciting the reaction gas and a space for depositing the film. In this embodiment, the reaction gas can be excited in a remote plasma chamber installed upstream of a reactor, and the film is deposited on the substrate in the reactor. The source gas and the additive gas can be introduced into the remote plasma chamber. In this case, the reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent application Ser. No. 09/511,934 filed Feb. 24, 2000 and Ser. No. 09/764,523 filed Jan. 18, 2001, U.S. Pat. No. 5,788,778, and U.S. Pat. No. 5,788,799. The disclosure of each of the above is incorporated herein by reference in its entirety.

5) In the method according to Item 3 or 4, the excitation of the reaction gas comprises exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber.

6) In the method according to any one of Items 1–3, the reaction space comprises a space for heating the reaction gas and a space for exciting the reaction gas and depositing the film. In this embodiment, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heater chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

7) In the method according to Item 6, the excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction:gas flows into the reactor for deposition of a film. In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber. The reaction space may be composed of the interior from a point where the excited additive gas and the source gas meet to an entrance to the reactor, and the interior of the reactor.

8) In the method according to any one of Items 1–7, the additive gas can be selected from the group consisting of nitrogen, argon, helium, and oxygen, but should not be limited thereto.

9) In the method according to any one of Items 1–8, the plasma polymerization reaction is conducted at a temperature of 350–450° C. However, the suitable temperature varies depending on the type of source gas, and one of ordinary skill in the art could readily select the temperature. In the present invention, polymerization includes any polymerization of two or more units or monomers, including oligomerization.

10) In the method according to any one of Items 1–9, the formation of the insulation film is conducted while maintaining a gas diffusing plate at a temperature of 150° C. or higher (e.g., 150° C. to 500° C., preferably 200° C. to 300° C.), through which the reaction gas flows into the reaction space, so that the reaction is promoted. In the above, the gas diffusing plate (or showerhead) may be equipped with a temperature control device to control the temperature. Conventionally, the temperature of the showerhead is not positively controlled and is normally 140° C. or lower when the temperature of the reaction space is 350–450° C., for example.

11) In the method according to any one of Items 1–10, the residence time is determined by correlating the dielectric constant with the residence time. This embodiment has been described earlier. The following embodiments also have been described earlier:

12) In the method according to any one of Items 1–11, the flow of the reaction gas is controlled to render the relative dielectric constant of the insulation film lower than 3.10.

13) In the method according to any one of Items 1–12, Rt is no less than 165 msec or 200 msec.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a film having a low dielectric constant and high mechanical hardness on a semiconductor substrate by plasma reaction, comprising the steps of:
   introducing a silicon-containing hydrocarbon gas as a source gas into a reaction space for plasma CVD processing wherein a semiconductor substrate is placed, said silicon-containing hydrocarbon being capable of self-polymerization or polymerization with cross-linkers to form siloxan polymers by plasma reaction; and
   applying radio-frequency (RF) power in excess of 2,000 W to the reaction space while maintaining a pressure of the reaction space at 100 Pa or higher to activate plasma polymerization reaction in the reaction space, thereby increasing hardness of a thin film forming on the semiconductor substrate.

2. The method according to claim 1, further comprising introducing an inert gas into the reaction space during the plasma polymerization reaction.

3. The method according to claim 1, wherein the pressure is 300–1,000 Pa.

4. The method according to claim 1, wherein the RF power is 15,000 W or lower.

5. The method according to claim 1, wherein the RF power is 3,000–10,000 W.

6. The method according to claim 1, wherein the substrate is a 300 mm wafer.

7. The method according to claim 1, wherein the RF power is applied by overlaying high-frequency power and low-frequency power.

8. The method according to claim 1, wherein an oxidizing gas is added to the source gas for plasma polymerization reaction.

9. The method according to claim 1, wherein a cross-linker gas is added to the source gas for plasma polymerization reaction.

10. The method according to claim 1, wherein the film has a dielectric constant of 2.5–3.2, and a hardness of 1.0 GPa–5.0 GPa.

11. The method according to claim 1, wherein the film has a dielectric constant of 2.8–3.1, and a hardness of 1.5 GPa–3.5 GPa.

12. The method according to claim 1, wherein the PF power is in excess of 4,000 W.

13. The method according to claim 1, wherein the source gas is a silicon-containing hydrocarbon compound having the formula

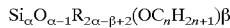

wherein α is an integer of 1–3, β is 0, 1, or 2, n is an integer of 1–3, and R is $C_{1-6}$ hydrocarbon attached to Si, and a cross-linking gas is added to the source gas as the cross linkers, said cross-linking gas being 1,2-propanediol.

14. The method according to claim 13, wherein the flow of the cross-linking gas is 30%–200% of the source gas.

15. The method according to claim 1, wherein the source gas is a silicon-containing hydrocarbon compound having the formula

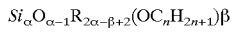

wherein α is an integer of 1–3, 0 is 0, 1, or 2, n is an integer of 1–3, and R is $C_{1-6}$ hydrocarbon attached to Si, and an oxidizing gas is added to the source gas as the cross linkers.

16. The method according to claim 15, wherein the flow of the oxidizing gas is less than 50% of the source gas.

17. The method according to claim 15, wherein the oxidizing gas is oxygen gas.

18. The method according to claim 1, wherein the flow of a reaction gas consisting of the source gas and an additive gas if any to lengthen a residence time, Rt, of the reaction gas in the reaction space, wherein 100 msec≦Rt, $$Rt[s]=9.42\times10^7(Pr\cdot Ts/Ps\cdot Tr)r_w^2 d/F$$

wherein Pr: reaction space pressure (Pa); Ps: standard atmospheric pressure (Pa); Tr: average temperature of the reaction gas (K); Ts: standard temperature (K); $r_w$: radius of the silicon substrate (m); d: space between the silicon substrate and the upper electrode (m); F: total flow volume of the reaction gas (sccm).

19. The method according to claim 1, wherein the plasma polymerization reaction is conducted at a temperature of 350° C.–450° C.

20. The method according to claim 1, wherein the temperature of a showerhead through which the source gas is introduced is controlled at a temperature of 150° C. or higher.

21. The method according to claim 20, wherein the temperature of the showerhead is 200° C.–300° C.

22. The method according to claim 1, wherein the pressure of the reaction space is maintained in the range of 300–1,000 Pa.

23. The method according to claim 1, wherein the thin film formed on the substrate consists of silicon, hydrogen, carbon, and oxygen.

24. A method for forming a film having a dielectric constant of 2.5–3.2 and a hardness of 1.0–5.0 GPa on a semiconductor substrate by plasma reaction, comprising the steps of:

introducing a silicon-containing hydrocarbon gas consisting of silicon, carbon, oxygen, and hydrogen, as a source gas into a reaction space for plasma CVD processing wherein a semiconductor substrate is placed, said silicon-containing hydrocarbon being capable of self-polymerization or polymerization with cross-linkers to form siloxan polymers by plasma reaction; and applying radio-frequency (RF) power in excess of 2,000 W to the reaction space while maintaining a pressure of the reaction space at 400 Pa or higher to activate plasma polymerization reaction in the reaction space, while controlling the temperature of the plasma polymerization reaction in the range of 350° C.–450° C. and the temperature of a showerhead through which the source gas is introduced in the range of 200° C.–300° C., thereby forming a thin film consisting of silicon, carbon, oxygen, and hydrogen, on the semiconductor substrate.

25. The method according to claim 24, wherein the RF power is in the range of 3,000 W to 10,000 W.

26. The method according to claim 24, wherein the RF power is in excess of 4,000 W.

27. The method according to, claim 24, wherein an inert gas is added to the source gas at a flow rate of 10%–200% of the source gas, and an oxidizing gas is further added to the source gas at a flow rate of 10%–30% of the source gas.

28. The method according to claim 24, wherein an inert gas is added to the source gas at a flow rate of 10%–200% of the source gas, and a cross linking gas which facilitates polymerization of the source gas is further added to the source gas at a flow rate of 50%–150% of the source gas.

29. A method for forming a film having a dielectric constant of 2.5–3.2 and a hardness of 1.0–5.0 GPa on a semiconductor substrate by plasma reaction, comprising the steps of:

introducing a silicon-containing hydrocarbon gas consisting of silicon, carbon, oxygen, and hydrogen, as a source gas into a reaction space for plasma CVD processing wherein a semiconductor substrate is placed, said silicon-containing hydrocarbon being capable of self-polymerization or polymerization with cross-linkers to form siloxan polymers by plasma reaction; and applying radio-frequency (RF) power in excess of 2,000 W to the reaction space while maintaining a pressure of the reaction space at 400 Pa or higher to activate plasma polymerization reaction in the reaction space, thereby forming a thin film on the semiconductor substrate, wherein hardness of the thin film is controlled as a function of the RF power level.

30. The method according to claim 29, wherein during the forming of the thin film, the temperature of the plasma polymerization reaction is controlled in the range of 350° C.–450° C., and the temperature of a showerhead through which the source gas is introduced is controlled in the range of 200° C.–300° C.

31. The method according to claim 29, wherein the thin film consists of silicon, carbon, oxygen, and hydrogen.

* * * * *

UNITED STATES PATENT AND TRADEMARK OFFICE
CERTIFICATE OF CORRECTION

PATENT NO. : 6,740,602 B1  Page 1 of 1
DATED : May 25, 2004
INVENTOR(S) : Menso Hendriks et al.

It is certified that error appears in the above-identified patent and that said Letters Patent is hereby corrected as shown below:

Title page,
Item [54], Title, delete "METHOD OF FORMING LOW-DIELECTRIC CONSTANT FILM ON SEMICONDUCTOR SUBSTRATE BY PLASMA REACTION USING HIGH-RF POWER" and insert -- METHOD FOR FORMING LOW-DIELECTRIC CONSTANT FILM ON SEMICONDUCTOR SUBSTRATE BY PLASMA REACTION USING HIGH-RF POWER --.

Column 4,
Line 64, delete "-$CH=CH_3$" and insert -- -$CH=CH_2$ --;

Column 5,
Line 9, delete "-$C_2H_{2(Z-W)+2}$" and insert -- -$C_2H_{2(Z-W)+1}$ --;
Line 12, delete "-$CH=CH_3$" and insert -- -$CH=CH_2$ --.

Signed and Sealed this

Twenty-third Day of November, 2004

JON W. DUDAS
*Director of the United States Patent and Trademark Office*